(12) United States Patent
Leobandung

(10) Patent No.: US 9,590,057 B2
(45) Date of Patent: Mar. 7, 2017

(54) REDUCED PARASITIC CAPACITANCE WITH SLOTTED CONTACT

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 14/242,909

(22) Filed: Apr. 2, 2014

(65) Prior Publication Data

US 2015/0287796 A1    Oct. 8, 2015

(51) Int. Cl.
*H01L 29/417* (2006.01)
*H01L 29/78* (2006.01)
*H01L 29/66* (2006.01)

(52) U.S. Cl.
CPC .. *H01L 29/41758* (2013.01); *H01L 29/41775* (2013.01); *H01L 29/41791* (2013.01); *H01L 29/66795* (2013.01); *H01L 29/78* (2013.01); *H01L 29/785* (2013.01); *H01L 29/7851* (2013.01); *H01L 29/66545* (2013.01)

(58) Field of Classification Search
CPC ............ H01L 21/76837; H01L 21/768; H01L 29/41775; H01L 29/66795; H01L 29/76804
See application file for complete search history.

(56) References Cited

U.S. PATENT DOCUMENTS

| | | | |
|---|---|---|---|
| 5,565,372 A * | 10/1996 | Kim | ............. H01L 23/5225 257/E23.152 |
| 6,501,108 B1 | 12/2002 | Suzuki et al. | |
| 6,756,644 B2 | 6/2004 | Stout | |
| 7,569,897 B2 | 8/2009 | Anderson et al. | |
| 7,843,016 B2 | 11/2010 | Anderson et al. | |
| 8,362,572 B2 | 1/2013 | Huang et al. | |
| 8,826,213 B1 * | 9/2014 | Ho | .................. G06F 17/5081 716/110 |

(Continued)

OTHER PUBLICATIONS

U.S. Appl. No. 15/045,342, Entitled "Reduced Parasitic Capacitance with Slotted Contact", filed Feb. 17, 2016.

(Continued)

*Primary Examiner* — Allen Parker
*Assistant Examiner* — Stephen Bradley
(74) *Attorney, Agent, or Firm* — John W. Hayes; Brian M. Restauro

(57) ABSTRACT

A FET device fabricated by providing a first conductor on a substrate, the first conductor having a first top surface with a first height above the substrate. A second conductor is provided adjacent the first conductor, the second conductor having a second top surface with a second height above the substrate. A portion of the second conductor is removed to provide a slot, wherein the slot is defined by opposing interior sidewalls and a bottom portion, such that the bottom portion of the slot is below the first height of the first conductor. An insulating material is deposited in the slot, the insulating material having a third top surface with a third height above the substrate, the third height being below the second height of the second conductor to provide space within the slot for a third conductor. The space within the slot is then filled with the third conductor.

5 Claims, 7 Drawing Sheets

(56) References Cited

U.S. PATENT DOCUMENTS

| | | | | |
|---|---|---|---|---|
| 8,933,511 B2* | 1/2015 | Nitta | ............ | H01L 29/41775 |
| | | | | 257/343 |
| 8,962,490 B1* | 2/2015 | Hung | ............ | H01L 21/76802 |
| | | | | 438/620 |
| 2012/0326237 A1* | 12/2012 | Ponoth | ............ | H01L 21/76895 |
| | | | | 257/368 |
| 2013/0059434 A1* | 3/2013 | Yang | ............ | H01L 21/28 |
| | | | | 438/586 |
| 2014/0306351 A1* | 10/2014 | Kim | ............ | H01L 21/76855 |
| | | | | 257/774 |
| 2015/0214291 A1* | 7/2015 | Park | ............ | H01L 24/02 |
| | | | | 257/503 |

OTHER PUBLICATIONS

Appendix P: List of IBM Patents or Patent Applications Treated as Related, Dated Feb. 17, 2016, 2 pages.

* cited by examiner

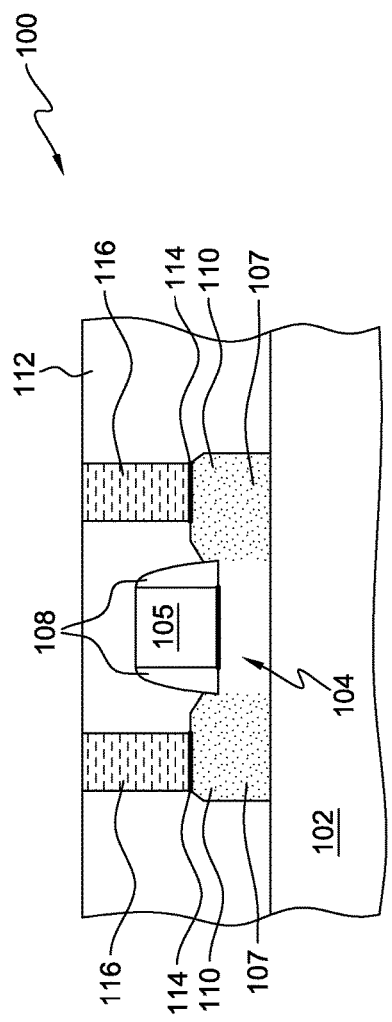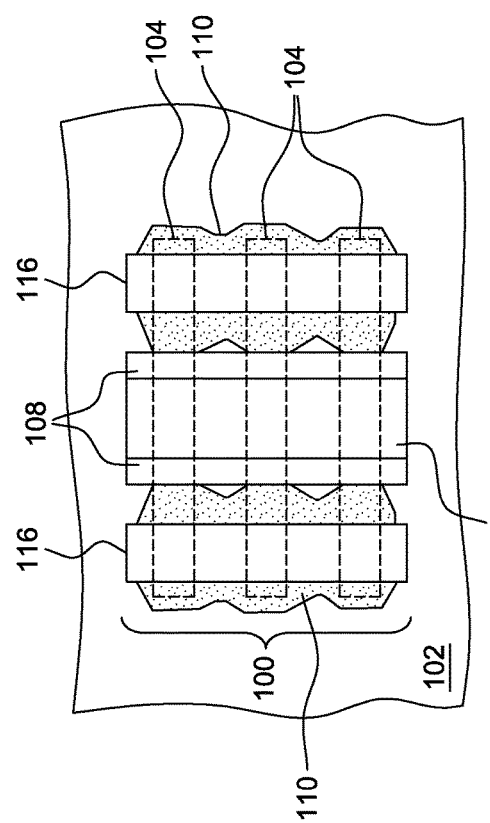

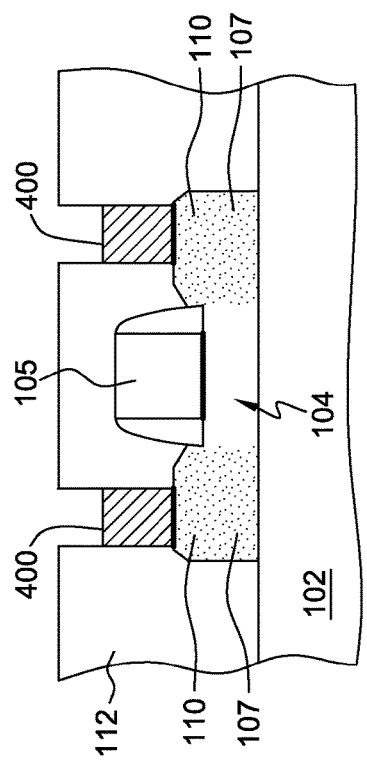
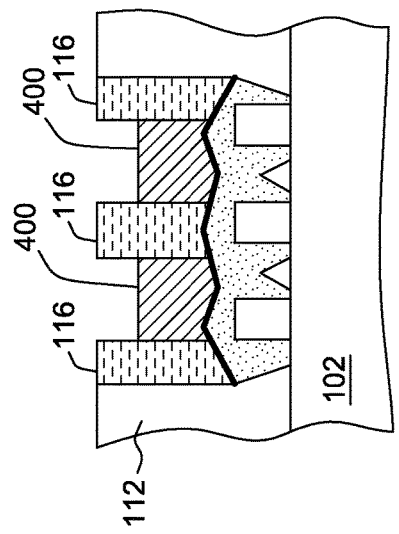
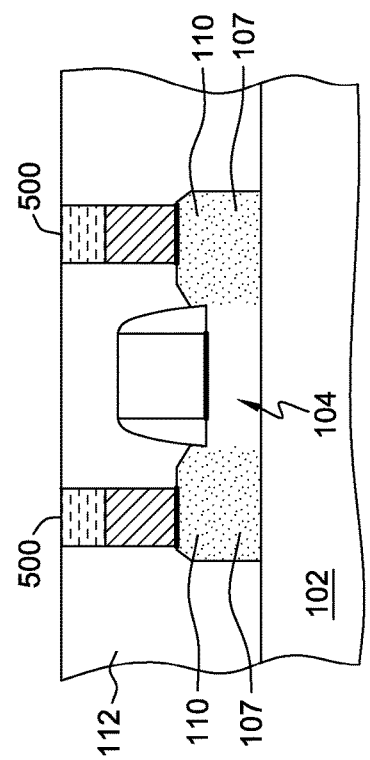
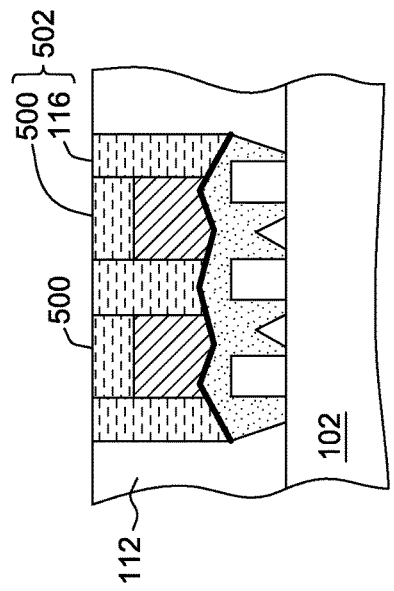

US 9,590,057 B2

REDUCED PARASITIC CAPACITANCE WITH SLOTTED CONTACT

FIELD OF THE INVENTION

The present invention relates generally to the fabrication of semiconductor devices, and more particularly to the fabrication of a FET device.

BACKGROUND OF THE INVENTION

Field effect transistors (FETs) can be semiconductor devices fabricated on a bulk semiconductor substrate or on a silicon-on-insulator (SOI) substrate. FET devices generally consist of a source, a drain, a gate, and a channel between the source and drain. The gate is separated from the channel by a thin insulating layer, typically of silicon oxide, called the field or gate oxide. A voltage drop generated by the gate across the oxide layer induces a conducting channel between the source and drain thereby controlling the current flow between the source and the drain. Current integrated circuit designs use complementary metal-oxide-semiconductor (CMOS) technology that use complementary and symmetrical pairs of p-type and n-type metal oxide semiconductor field effect transistors (MOSFETs) for logic functions.

The integrated circuit industry is continually reducing the size of the devices, increasing the number of circuits that can be produced on a given substrate or chip. It is also desirable to increase the performance of these circuits, increase the speed, and reduce the power consumption.

A three dimensional chip fabrication approach, such as a finFET, has been developed for semiconductor devices. A finFET is a non-planar FET versus the more standard planar FET. The "fin" is a narrow, vertical silicon base channel between the source and the drain. The fin is covered by the thin gate oxide and surrounded on two or three sides by an overlying gate structure. The multiple surfaces of the gate allow for more effective suppression of "off-state" leakage current. The multiple surfaces of the gate also allow enhanced current in the "on" state, also known as drive current. These advantages translate to lower power consumption and enhanced device performance.

Process challenges exist as the dimensions of the planar and non-planar devices decrease, some now falling below 20 nm. Capacitance is the ability to store an electric charge, and parasitic capacitance is common inside electronic devices whenever two conductors are parallel to each other. As the dimensions of the devices decrease, the spacing between the various circuit elements also decreases, leading to increased parasitic capacitance. Parasitic capacitance is the unwanted capacitance that exists between the parts of an electronic component or circuit simply because of their proximity to each other. The increased parasitic capacitance can have detrimental effects on the circuit performance, limiting the frequency response of the device.

SUMMARY

Embodiments of the present invention provide a reduced parasitic capacitance FET device and include a method of fabricating the same. In the method of fabrication of the reduced parasitic capacitance FET device, a first conductor is provided on a substrate, the first conductor having a first top surface with a first height above the substrate. A second conductor is provided adjacent the first conductor, the second conductor having a second top surface with a second height above the substrate. A portion of the second conductor is removed to provide a slot therethrough, wherein the slot is defined by opposing interior sidewalls and a bottom portion, such that the bottom portion of the slot is below the first height of the first conductor. An insulating material is deposited in the slot, the insulating material having a third top surface with a third height above the substrate, the third height being below the second height of the second conductor to provide space within the slot for a third conductor. The space within the slot is then filled with the third conductor.

BRIEF DESCRIPTION OF THE SEVERAL VIEWS OF THE DRAWINGS

FIG. 1C depicts a cross-sectional view of additional fabrication steps, in accordance with embodiments of the invention. FIG. 1D depicts a planar view of finFET 100, in accordance with embodiments of the invention.

FIG. 4B depicts a cross-sectional view taken through section line 3B-3B of FIG. 3A showing the filling of a slot, in accordance with embodiments of the invention. FIG. 4C depicts a cross-sectional view taken through section line 3C-3C of FIG. 3A.

FIG. 5B depicts a cross-sectional view taken through section line 3B-3B of FIG. 3A showing the deposition of a contact cap, in accordance with embodiments of the invention. FIG. 5C depicts a cross-sectional view taken through section line 3C-3C of FIG. 3A.

DETAILED DESCRIPTION

Figure 1A:
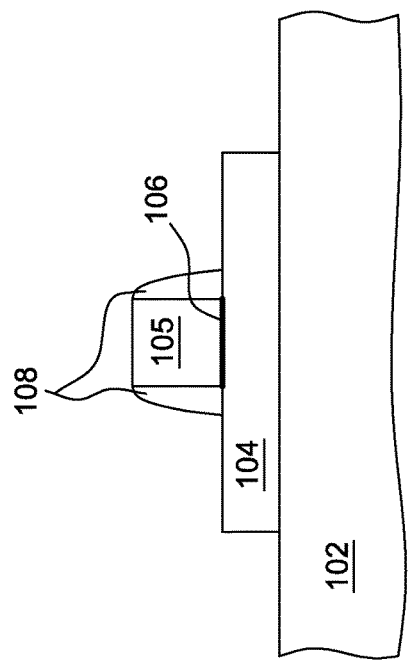
FIG. 1A depicts a cross-sectional view of fabrication steps of a finFET device, in accordance with embodiments of the invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Embodiments of the present invention generally provide a reduced parasitic capacitance FET device. Forming a slotted contact structure, wherein portions of the source/drain contact may be removed, reduces the surface area of the source/drain contacts in proximity to the gate. The reduced surface area of the source/drain contacts in proximity to the gate can reduce the parasitic capacitance of the FET device. Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

FIG. 1A depicts a cross-sectional view of fabrication steps of a finFET device, in accordance with embodiments of the invention. Specifically, FIG. 1A depicts fin 104, which is formed on substrate 102. Substrate 102 is a semiconductor material, such as silicon, silicon germanium alloys, silicon carbon alloys, or silicon germanium carbon alloys. Substrate 102 can be a silicon-on-insulator (SOI) wafer having a buried oxide layer (not shown). In other embodiments, substrate 102 can be a group III-V compound, such as indium gallium arsenide, indium phosphide, or indium antimonide.

Fin 104 is fabricated on substrate 102. In various embodiments, fin 104 is fabricated from substrate 102 using standard lithographic and etching processes known to someone skilled in the art. In other embodiments, fin 104 may be fabricated from a semiconductor layer (not shown) included in an SOI substrate (not shown). Gate structure 105 and gate oxide 106 are fabricated over a portion of fin 104. It should be appreciated by one skilled in the art that gate structure 105 may use a gate first process, whereby gate structure 105, with gate oxide 106, is fabricated prior to the formation of the source/drain regions, and described further below. In other embodiments, gate structure 105 may be a replacement metal gate (RMG) structure wherein a dummy gate is replaced with a metal gate structure subsequent to the formation of source/drain regions 110. Spacer 108 may be formed on the sidewall of gate structure 105, or on the sidewall of a dummy gate, in the case of a replacement metal gate.

Figure 1B:
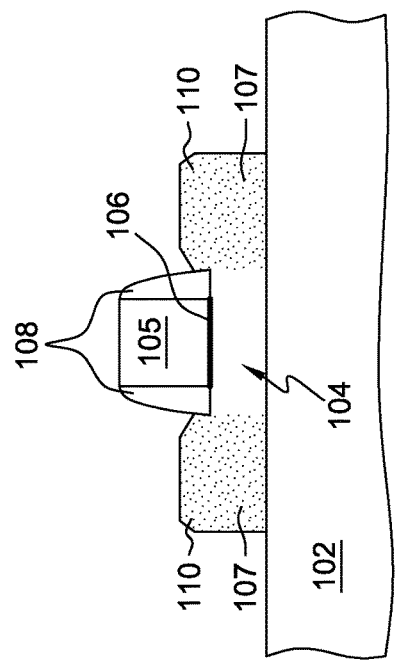
FIG. 1B depicts a cross-sectional view of additional fabrication steps, in accordance with embodiments of the invention.

FIG. 1B depicts a cross-sectional view of additional fabrication steps, in accordance with embodiments of the invention. Source/drain regions 110 are doped regions of n-type or p-type semiconductor that act as the source and drain of the finFET device. Spacer 108 can separate gate structure 105 from source/drain region 110. In various embodiments, source/drain regions 110 are formed by the epitaxial growth of n-type or p-type semiconductor using, for example, selective epitaxy, wherein the epitaxial layer grows from the exposed portion of fin 104. The type of dopant is selected based on the type of MOSFET. For example, the source and drain regions of an nFET type of transistor are doped with a Group V material such as phosphorous, arsenic, or antimony. The source and drain regions of a pFET type of transistor are doped with a Group III material such as boron or indium. The process for forming source/drain regions 110 may permit diffusion into underlying fin 104, creating doped regions 107 beneath the source/drain regions 110. Because diffusion into fin 104 occurs from both the top and sides of fin 104, doped regions 107 may be generally rectangular in cross-section, as illustrated in FIG. 1B.

It is understood by someone skilled in the art that faceted epitaxial growth may be preferred because of improved electrical characteristics such as reduced parasitic capacitance. Faceted epitaxial growth can be accomplished with certain epitaxy conditions such as chemical vapor deposition (CVD). In various embodiments, source/drain region 110 is connected between adjacent fins 104 by the epitaxial growth of source/drain region 110, and depicted further with respect to FIG. 1B. In other embodiments, fins 104 may be connected in source/drain region 110 during the formation of the fins 104.

FIG. 1C depicts a cross-sectional view of additional fabrication steps, in accordance with embodiments of the invention. Insulating layer 112 is deposited over substrate 102, fin 104, source/drain region 110, gate structure 105, and spacer 108. Insulating layer 112 can include, without limitation, any insulating material such as silicon oxide, silicon nitride, or silicon carbide, using, for example, CVD, physical vapor deposition (PVD), plasma assisted chemical vapor deposition (PACVD), plasma enhanced chemical vapor deposition (PECVD), low pressure chemical vapor deposition (LPCVD), atomic layer deposition (ALD). It can be appreciated by someone skilled in the art that insulating layer 112 can be any insulating material that acts to insulate and protect the finFET device.

Openings can be formed in insulating layer 112 by known processing steps, such as lithographic and etch processes, to provide access to source/drain regions 110 for contacts 116. In various embodiments, liner 114 is a thin layer of metal silicide deposited or alloyed on the exposed silicon surfaces, including the exposed portions of source/drain region 110, using, for example cobalt, titanium, tungsten or nickel. Contact 116 can then be formed by depositing a conducting material such as tungsten or aluminum into the formed opening, over liner 114, and on the surface of insulating layer 112. Chemical-mechanical planarization (CMP) may be used to remove excess conducting material from the surface of insulating layer 112, electrically isolating the various conductors (i.e., contact 116), and to smooth the surface and even out any irregular topography using a combination of chemical etching and mechanical polishing.

FIG. 1D depicts a planar view of finFET 100, in accordance with embodiments of the invention. Insulating layer 112 of FIG. 1C is not shown for clarity of the figure. Fins 104 can be formed from substrate 102 as describe above.

Gate structure 105 is formed over fins 104 as described above. Spacer 108 is shown formed on the sidewalls of gate structure 105. Source/drain regions 110 are formed over fins 104 using selective epitaxy, and more specifically, faceted epitaxy, in accordance with an embodiment of the invention. Source/drain region 110 is connected between adjacent fins 104 by the epitaxial growth of source/drain region 110. Contact 116 is formed over source/drain region 110.

Figure 2A:
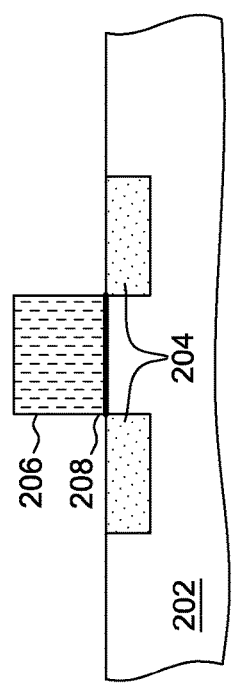
FIG. 2A depicts a cross-sectional view of fabrication steps of a planar FET device, in accordance with another embodiment of the invention.

FIG. 2A depicts a cross-sectional view of fabrication steps of a planar FET device, in accordance with another embodiment of the invention. Specifically, FIG. 2A depicts source/drain regions 204, formed in substrate 202. Substrate 202 is a semiconductor material, such as silicon, silicon germanium alloys, silicon carbon alloys, or silicon germanium carbon alloys. Substrate 202 can be a silicon-on-insulator (SOI) wafer having a buried oxide layer (not shown). In other embodiments, substrate 202 can be a group III-V compound including, but not limited to, indium gallium arsenide, indium phosphide, or indium antimonide.

The planar FET includes source/drain regions 204 formed in substrate 202. Source/drain regions 204 are doped semiconductor regions that perform a similar function to source/drain regions 110 of the finFET device of FIG. 1C. In various embodiments, source/drain regions 204 may be formed by doping portions of substrate 202 using ion implantation. The type of dopant is selected based on the type of MOSFET. For example, the source and drain regions of an nFET type of transistor are doped with a Group V material such as phosphorous, arsenic, or antimony. The source and drain regions of a pFET type of transistor are doped with a Group III material such as boron or indium.

Gate structure 206 and gate oxide 208 are formed on substrate 202, and perform similar functions to gate structure 105 of the finFET device of FIG. 1C. It should be appreciated by one skilled in the art that gate structure 206 may use a gate first process, whereby gate structure 206, with gate oxide 208, is fabricated prior to the formation of the source/drain regions 204. In other embodiments, gate structure 206 may be a replacement metal gate structure wherein a dummy gate is replaced with a metal gate structure subsequent to the formation of source/drain regions 204.

Figure 2B:
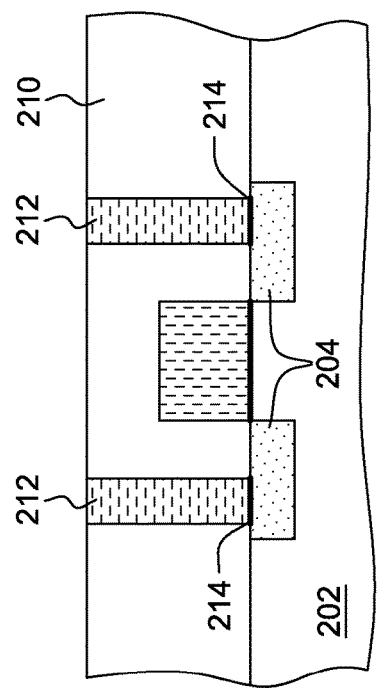
FIG. 2B depicts a cross-sectional view of additional fabrication steps of a planar FET device, in accordance with another embodiment of the invention.

FIG. 2B depicts a cross-sectional view of additional fabrication steps of a planar FET device, in accordance with another embodiment of the invention. In various embodiments of the invention, insulating layer 210 can be deposited over substrate 202, source/drain regions 204, and gate structure 206. Insulating layer 210 may include, without limitation, any insulating material such as silicon oxide, silicon nitride, or silicon carbide, deposited using, for example, any of the above-referenced methods. It can be appreciated by someone skilled in the art that the insulating layer can be any insulating material that acts to insulate and protect the planar FET device.

Openings can be formed in insulating layer 210 by known processing steps, such as lithographic and etch processes, to provide access to source/drain regions 204 for source/drain contact 212. In various embodiments, liner 214 is a thin layer of metal silicide deposited or alloyed on the exposed silicon surfaces, including the exposed portions of source/drain region 204, using, for example cobalt, tungsten, titanium, or nickel. Source/drain contact 212 can then be formed by depositing a contact metal such as tungsten, copper, or aluminum into the opening, over liner 214 and over the surface of the insulating layer. CMP may be used to remove excess contact metal from the surface of the insulating layer to electrically isolate the various conductors (i.e., source/drain contact 212), and to smooth the surface and even out any irregular topography.

Figure 2C:
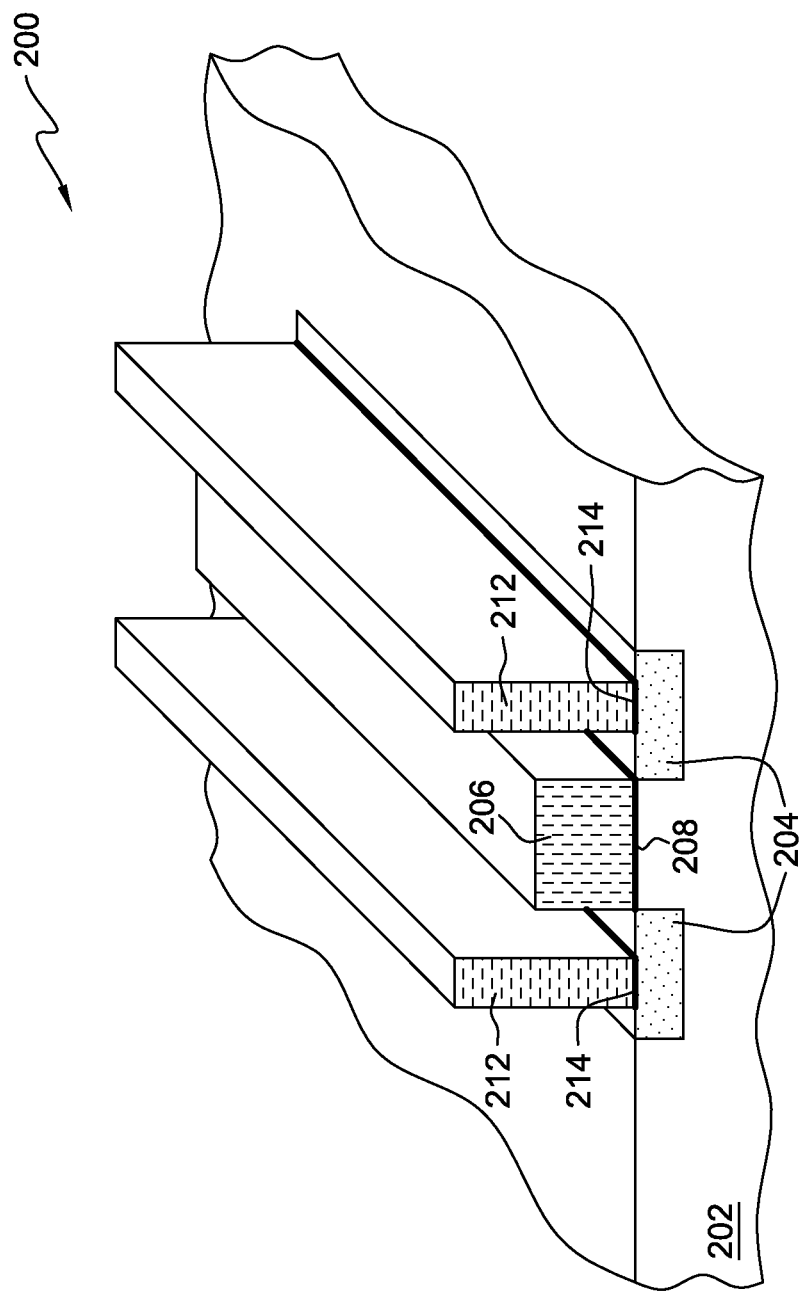
FIG. 2C depicts a perspective view of the planar FET device, in accordance with another embodiment of the invention.

FIG. 2C depicts a perspective view of the planar FET device, in accordance with another embodiment of the invention. Insulating layer 210 of FIG. 2B is not shown for clarity of the figure.

The finFET device of FIGS. 1A-1D, hereinafter finFET 100, and the planar FET device of FIG. 2A-2C, hereinafter planar device 200, are presented as simplified examples of various semiconductor devices in accordance with the invention, and are not meant to limit the scope of the invention.

Figure 3A:
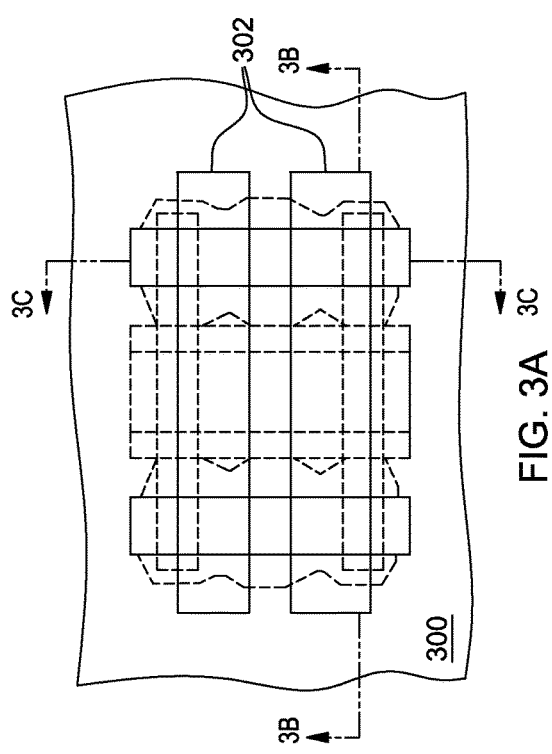
FIG. 3A depicts a planar view of a finFET device of FIG. 1A, depicting the removal of a portion of a contact, forming a slot, in accordance with embodiments of the invention.
Figure 3C:
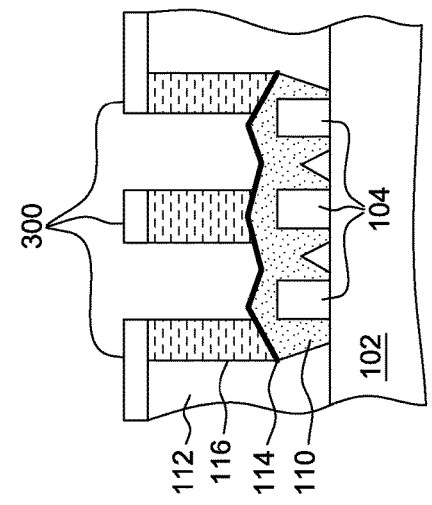
FIG. 3C depicts a cross-sectional view of FIG. 3A taken through section line 3C-3C.
Figure 3B:
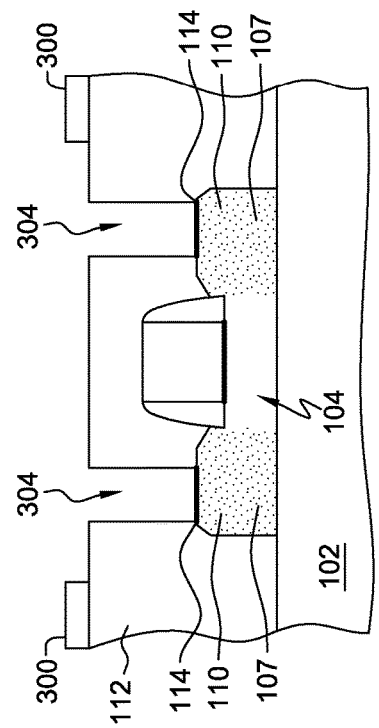
FIG. 3B depicts a cross-sectional view of FIG. 3A taken through section line 3B-3B.

FIG. 3A depicts a planar view of finFET device 100 of FIG. 1C, depicting the removal of a portion of contact 116, forming slot 304 (shown in FIG. 3B), in accordance with embodiments of the invention. FIG. 3B depicts a cross-sectional view of FIG. 3A taken through section line 3B-3B. FIG. 3C depicts a cross-sectional view of FIG. 3A taken through section line 3C-3C. In various embodiments, mask layer 300 may be deposited over insulating layer 112 of FIG. 1C, comprising, for example, a layer of photoresist. Standard lithographic processes may be used to form pattern 302 in mask layer 300, as illustrated in FIG. 3A. It can be appreciated by someone skilled in the art that additional layers (not shown), such as a hard mask layer, may be included between mask layer 300 and insulator layer 112 to facilitate the imaging and etch processes. Portions of contact 116 not covered by mask layer 300 can be removed using a wet etch, such as a metal etchant or a dry etch such as reactive ion etch (RIE). In various embodiments, contact 116 is completely removed from the areas not covered by mask layer 300 forming slot 304 in contact 116, and exposing liner 114. In other embodiments, a timed etch may be used to form slot 304 in contact 116, whereby a portion of contact 116 not covered by mask layer 300 remains subsequent to the etch process (not shown). This may be required, for example, if adjacent fins 104 are not connected by the selective epitaxial growth of source/drain regions 110.

FIG. 4B depicts a cross-sectional view taken through section line 3B-3B of FIG. 3A showing the filling of slot 304, in accordance with embodiments of the invention. FIG. 4C depicts a cross-sectional view taken through section line 3C-3C of FIG. 3A. In various embodiments, a slot insulating material (not shown) is deposited over the surface of insulator layer 112, filling slot 304 of FIG. 3B. The slot insulating material can include, without limitation, silicon oxide, silicon nitride, or silicon carbide, deposited using, for example, any of the above referenced methods. The slot insulating layer may also include an insulating material known to someone skilled in the art, formed using chemical solution deposition (such as spin coating). It is desirable that the slot insulating material be selected such that it can be etched preferentially with respect to insulator layer 112. In another embodiment, the slot insulating material is deposited using process conditions that allow for a substantially higher etch rate, for example, decreasing the CVD temperature of, for example, silicon oxide. Following the deposition of the slot insulating material, an etch process can be used to remove the top portion of the slot insulating material from slot 304, forming slot insulator 400. In various embodiments, the etch process is controlled such that the top surface of slot insulator 400 is above the top surface of gate structure 105. In other embodiments, the etch process is controlled such that the top surface of slot insulator 400 is determined by the desired electrical properties of finFET device 100, such as electrical resistance of contact 116 and/or the capacitance between contact 116 and gate structure 105.

FIG. 5B depicts a cross-sectional view taken through section line 3B-3B of FIG. 3A showing the deposition of contact cap 500, in accordance with embodiments of the invention. FIG. 5C depicts a cross-sectional view taken through section line 3C-3C of FIG. 3A. In various embodiments, contact cap 500 is formed by depositing a contact metal such as tungsten, copper, or aluminum over the surface of insulator layer 112, filling the recess created by the partial etch of the slot insulating material creating slot insulator 400. The contact cap 500 can be formed without using lithography, since the slot insulator 400 is recessed. Chemical-mechanical planarization (CMP) may be used to remove excess contact metal from the surface of insulating layer 112 electrically isolating the various slotted conductors (i.e., slotted contact 502), and to smooth the surface and even out any irregular topography. The result is slotted contact 502 that includes the remaining portions of contact 116 subsequent to the formation of slot insulator 400, and contact cap 500.

Figure 6:
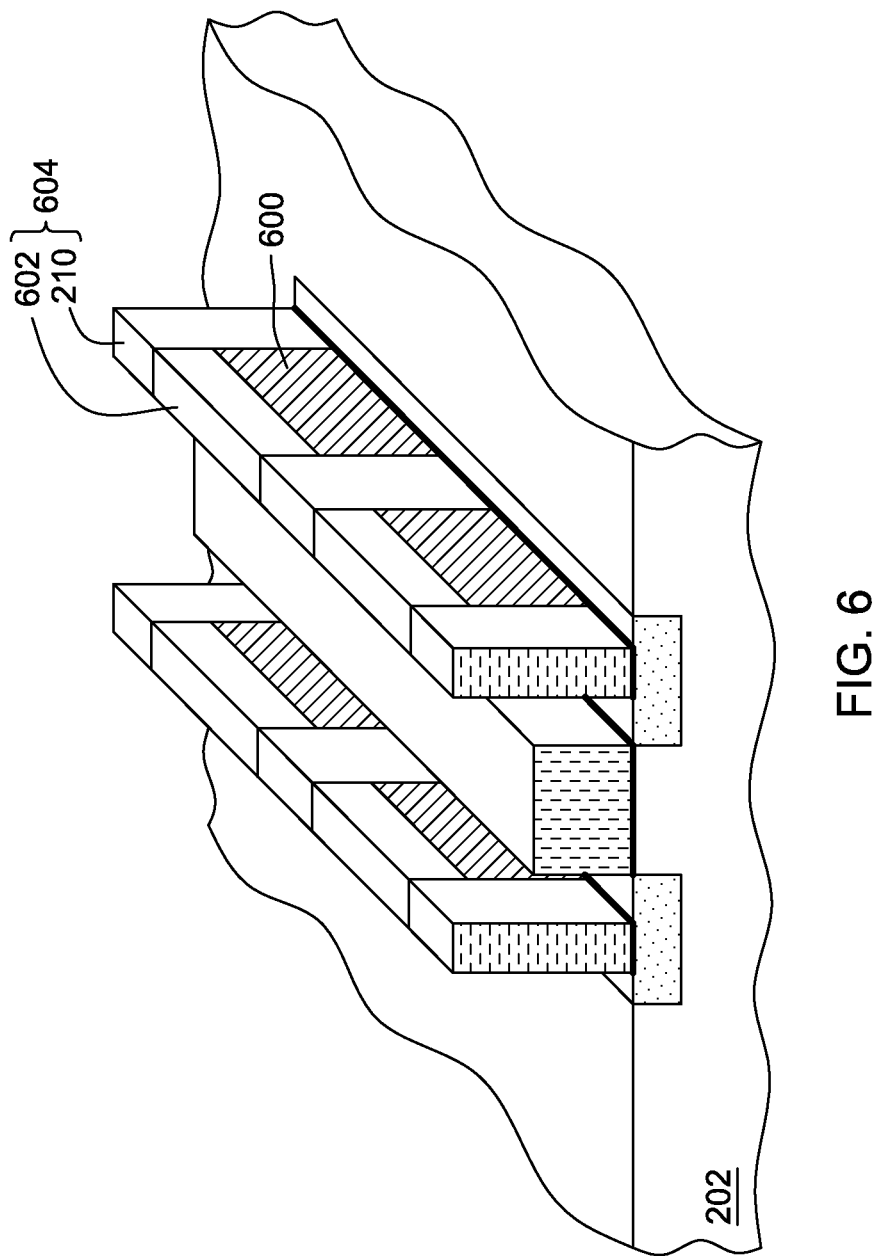
FIG. 6 depicts a simplified perspective view of a planar device of FIG. 2, fabricated on a substrate, and including a slotted contact, in accordance with another embodiment of the invention.

FIG. 6 depicts a simplified perspective view of planar device 200 of FIG. 2, fabricated on substrate 202, and including slotted contact 604, in accordance with another embodiment of the invention. In various embodiments, slotted contact 604 may be formed in the same fashion as slotted contact 502 of finFET device 100, as depicted with respect to FIGS. 3A through 5C. Slot insulator 600 may be formed in the same fashion as slot insulator 400 of FIG. 4B. Contact cap 602 may be formed in the same fashion as contact cap 500 of FIG. 5B. Slotted contact 604 includes the remaining portions of contact 210 subsequent to the formation of slot insulator 600, and contact cap 602.

The resulting semiconductor device may be included on a semiconductor substrate consisting of many devices and one or more wiring levels to form an integrated circuit chip. The resulting integrated circuit chip(s) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described various embodiments of a reduced parasitic capacitance FET device (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A method for fabricating a semiconductor device, the method comprising: providing a first conductor on a substrate, the first conductor having a first top surface with a first height above the substrate;
providing a thin layer of metal silicide adjacent to the first conductor;
providing a second conductor adjacent in direct contact with the metal silicide, the second conductor having a second top surface with a second height above the substrate and a bottom surface that interacts directly with the first top surface of the metal silicide;
removing a portion of the second conductor to provide a slot therethrough, wherein the slot is defined by opposing interior sidewalls and a bottom portion, such that the bottom portion of the slot is below the first height of the first conductor and reaches the metal silicide;
depositing an insulating material in the slot on top of the thin layer of metal silicide, the insulating material having a third top surface with a third height above the substrate, the third height being below the second height of the second conductor to provide space within the slot for a third conductor, wherein the insulating material is silicon oxide, and wherein the third conductor is a contact metal selected from a group comprising: tungsten, copper, and aluminum;
filling the space within the slot with the third conductor having a fourth top surface with a fourth height above the substrate, the fourth height being equal to the second height of the second conductor without the use of lithography; and
reducing parasitic capacitance in the semiconductor device, wherein parasitic capacitance is reduced by removing the portion of the second conductor and depositing the insulating material in the slot and filling the space within the slow with the third conductor.

2. The method of claim 1, wherein the third height of the third top surface of the insulating material is above the first height of the first top surface of the first conductor.

3. The method of claim 1, wherein the bottom portion of the slot extends to a bottom portion of the second conductor.

4. The method of claim 1, wherein the height of the top surface of the insulating material is determined at least in part by resistance requirements of the semiconductor device.

5. The method of claim 1, wherein the second conductor is a source or drain contact.

* * * * *